(12) United States Patent
Yang et al.

(10) Patent No.: US 8,648,250 B2
(45) Date of Patent: Feb. 11, 2014

(54) MULTI-STACK SEMICONDUCTOR DEVICE

(75) Inventors: Chang-Shiang Yang, Taoyuan (TW);
Ke-Hsuan Liu, Taoyuan (TW);
Chih-hsien Chien, Taoyuan (TW)

(73) Assignee: Sun Well Solar Corporation, Taoyuan (TW)

( * ) Notice: Subject to any disclaimer, the term of this patent is extended or adjusted under 35 U.S.C. 154(b) by 209 days.

(21) Appl. No.: 13/225,112

(22) Filed: Sep. 2, 2011

(65) Prior Publication Data

US 2012/0056306 A1 Mar. 8, 2012

(30) Foreign Application Priority Data

Sep. 6, 2010 (TW) .............................. 99130005 A

(51) Int. Cl.
*H01L 31/00* (2006.01)
(52) U.S. Cl.
USPC ............................................. 136/256; 257/53
(58) Field of Classification Search
USPC ............................................. 257/53; 136/256
See application file for complete search history.

(56) References Cited

U.S. PATENT DOCUMENTS

| | | | | |
|---|---|---|---|---|
| 6,632,993 | B2 * | 10/2003 | Hayashi et al. | ............... 136/256 |
| 2005/0272175 | A1 * | 12/2005 | Meier et al. | ...................... 438/22 |
| 2009/0014064 | A1 * | 1/2009 | Shinohara | ...................... 136/256 |

FOREIGN PATENT DOCUMENTS

| | | |
|---|---|---|
| CN | 101567303 B | 7/2011 |
| TW | 510051 | 11/2002 |

* cited by examiner

*Primary Examiner* — David Vu
*Assistant Examiner* — Brandon Fox
(74) *Attorney, Agent, or Firm* — Chun-Ming Shih; HDLS IPR Services

(57) ABSTRACT

A multi-stack semiconductor device comprises: a substrate; a first conductive layer, a first group of the semiconductor material layers and a second group of the semiconductor material layers. The first conductive layer is formed on the substrate scribed by laser on the bottom of the first conductive layer to form a plurality of the first scribe lines. The first group of the semiconductor material layers is formed on the first conductive layer, and the second group of the semiconductor material layers is formed on the first group of the semiconductor material layers. The first group of the semiconductor material layers and the second group of the semiconductor material layers are simultaneously scribed by laser on bottom of the first group of the semiconductor material layers to form a plurality of the second scribe lines. Each second scribe line is comprised of a plurality of the second pores. The second conductive layer is formed on the second group of the semiconductor material layers and is scribe by laser on the bottom of the first group of the semiconductor material layers to form a plurality of the third scribe lines. The second pores are shortened for shortening the horizontal distance of the first scribe lines and the second scribe lines and/or the horizontal distance of the second scribe lines and the third scribe lines.

36 Claims, 9 Drawing Sheets

MULTI-STACK SEMICONDUCTOR DEVICE

BACKGROUND OF THE INVENTION

1. Field of the Invention

The present invention relates to a multi-stack semiconductor device.

2. Description of Prior Art

Among methods for manufacturing semiconductor devices, for example, the method for manufacturing thin film solar cell includes depositing a plurality of film layers to form thin film of optoelectronic components on the substrate. The thin film optoelectronic components comprise a first conductive layer, a plurality of thin film layers made by semiconductor materials and a second conductive layer for absorbing and transform optical energy into electrical energy. Multiple laser scribing processes are performed to form a plurality of cell modules in series. For the purpose to maximize the power generated by the semiconductor device effective operation area, it is critical to minimize the area made by the laser scribing which does not contribute to generate power. As a result, when perform laser scribing, it is important to keep each scribe line as close to each other as possible. However, an appropriate miss distance between scribe lines is also necessary so as to avoid issues such as scribe lines may overlap with each other or leakage currents may occur.

TW Pat. Certification No. 167815 "Partially Transparent Photovoltaic Modules" disclosed a method using laser scribing for removing at least part of the back electrode in a solar cell for making a partially transparent photovoltaic module, wherein the width of each scribe line is about 0.01 to 0.5 mm, and the distance between scribe lines is about 0.5 to 5 mm.

The CN Pat. Publication No. CN101567303 "Laser film engraving equipment, scribing method and amorphous silicon film photovoltaic panel manufactured by the same" disclosed a laser film engraving equipment and a scribing method for manufacturing amorphous silicon film photovoltaic panel in order to minimize the area made by the laser scribing which does not contribute to generate power.

Consequently, the objectives of the present invention are: first, shortening pore dimensions and enlarging the distance between neighboring pores of the same scribe line in order to improve manufacturing cost and time efficiency; and second shortening the horizontal distances between scribe lines in order to increase the semiconductor device effective operation area and at the same time keep an appreciate miss distance.

SUMMARY OF THE INVENTION

The present invention discloses a multi-stack semiconductor device with an increased effective operation area. The semiconductor device comprises: a substrate; a first conductive layer formed on the substrate, the first group of the semiconductor material layers and the second group of the semiconductor material layers. The first conductive layer being scribed by laser and the scribing being on the bottom of the first conductive layer to form a plurality of the first scribe lines whereby part of the first conductive layer is removed and the substrate damage is minimized. Each first scribe line is comprised of a plurality of the first pores, and each first pore partially overlaps with the neighboring first pore. The first group of the semiconductor material layers is comprised of a plurality of the semiconductor material layers and is formed on the first conductive layer. The second group of the semiconductor material layers is comprised of a plurality of the semiconductor material layers and is formed on the first group of the semiconductor material layers. The first group of the semiconductor material layers and the second group of the semiconductor material layers are simultaneously scribed by laser and the scribing being on the bottom of the first group of the semiconductor material layers, whereby part of the first group of the semiconductor material layers and part of the second group of the semiconductor material layers are removed and the first conductive layer damage is minimized to form a plurality of the second scribe lines. Each second scribe line is comprised of a plurality of the second pores. The second conductive layer is formed on the second group of the semiconductor material layers. The second conductive layer is scribed by laser and the scribing is on the bottom of the first group of the semiconductor material layers, whereby part of the first group of the semiconductor material layers, part of the second group of the semiconductor material layers and part of the second conductive layer are removed and the first conductive layer damage is minimized to form a plurality of the third scribe lines. Each third scribe line is comprised of a plurality of the third pores, and each third pore partially overlaps with the neighboring third pore. The second pores are shortened for shortening horizontal distance between the first scribe lines and the second scribe lines and/or the horizontal distance between the second scribe lines and the third scribe lines whereby the semiconductor device effective operation area is increased.

According to the embodiment of the present invention, semiconductor device further comprises: middle layers located between the first group of the semiconductor material layers and the second group of the semiconductor material layers, wherein the middle layers, the first group of the semiconductor material layers and the second group of the semiconductor material layers are scribed by laser simultaneously.

According to the embodiment of the present invention, each second pore partially overlaps with the neighboring second pore.

According to the embodiment of the present invention, each second pore is distant from the neighboring second pore.

According to the embodiment of the present invention, the shortest distance between the central point of each second pore and the central point of the neighboring second pore is at least 20 μm.

According to the embodiment of the present invention, the shortest distance between the central point of the second pore and the pore boundary is less than 20 μm.

According to the embodiment of the present invention, the shortest distance between the central point of the first pores and the pore boundary is 5 to 20 μm.

According to the embodiment of the present invention, the shortest distance between the central point of the third pores and the pore boundary is 15 to 40 μm.

According to the embodiment of the present invention, the distance between the first scribe line and the second scribe line and/or the distance between the third scribe line and the second scribe line is less than 80 μm.

According to the embodiment of the present invention, the conductivity of the circuit channels formed by the second pores is at least 50 S, and the first conductive layers contact with the second conductive layers via the circuit channels.

The present invention discloses a multi-stack semiconductor device with an increased effective operation area, the semiconductor device comprising: a substrate; a first conductive layer formed on the substrate, the first group of the semiconductor material layers, and the second group of the semiconductor material layers. The first conductive layer is scribed by laser and the scribing is on the bottom of the first conductive layer to form a plurality of the first scribe lines whereby part of the first conductive layer is removed and the substrate damage is minimized. Each first scribe line is comprised of a plurality of the first pores, and each first pore partially overlaps with the neighboring first pore. The first group of the semiconductor material layers is comprised of a plurality of the semiconductor material layers and is formed on the first conductive layer. The first group of the semiconductor material layers is scribed by laser and the scribing is on the bottom of the first group of the semiconductor material layers, whereby part of the first group of the semiconductor material layers is removed and the first conductive layer is minimized to form a plurality of the second A scribe lines. Each second A scribe line is comprised of a plurality of the second A pores. The second group of the semiconductor material layers is comprised of a plurality of the semiconductor material layers and formed on the first group of the semiconductor material layers, the second group of the semiconductor material layers is scribed by laser and the scribing is on the bottom of the first group of the semiconductor material layers, whereby part of the first group of the semiconductor material layers and part of the second group of the semiconductor material layers are removed and the first conductive layer damage is minimized to form a plurality of the second B scribe lines. Each second B scribe line is comprised of a plurality of the second B pores; and the second conductive layer is formed on the second group of the semiconductor material layers. The second conductive layer is scribed by laser and the scribing is on the bottom of the first group of the semiconductor material layers, whereby part of the first group of the semiconductor material layers, part of the second group of the semiconductor material layers and part of the second conductive layer are removed and the first conductive layer damage is minimized to form a plurality of the third scribe lines. Each third scribe line is comprised of a plurality of the third pores, and each third pore partially overlaps with the neighboring third pore. The second A pores and/or the second B pores are shortened for shortening the horizontal distance between the first scribe lines and the second A scribe lines, the horizontal distance between the second A scribe lines and the second B scribe lines and/or the horizontal distance between the second B scribe lines and the third scribe lines, whereby the semiconductor device effective operation area is increased.

According to the embodiment of the present invention, semiconductor device further comprises: middle layers located between the first group of the semiconductor material layers and the second group of the semiconductor material layers, the middle layers and the first group of the semiconductor material layers being simultaneously scribed by laser.

According to the embodiment of the present invention, each second A pore partially overlaps with the neighboring second A pore, and/or each second B pore partially overlaps with the neighboring second B pore.

According to the embodiment of the present invention, each second A pore is distant from the neighboring second A pore, and/or each second B pore is distant from the neighboring second B pore.

According to the embodiment of the present invention, the distance between the central point of each second A pore and the central point of the neighboring second A pore and/or the shortest distance between the central point of each second B pore and the central point of the neighboring second B pore are at least 20 μm.

According to the embodiment of the present invention, the shortest distance between the second A pores and/or the central point of the second B pores and the boundary of the pores is less than 20 μm.

According to the embodiment of the present invention, the shortest distance between the central point of the first pores and the pore boundary is 5 to 20 μm.

According to the embodiment of the present invention, the shortest distance between the central point of the third pores and the pore boundary is 15 to 40 μm.

According to the embodiment of the present invention, the horizontal distance between the first scribe lines and the second A scribe lines, the horizontal distance between the second A scribe lines and the second B scribe lines, and/or the horizontal distance between the second B scribe lines and the third scribe lines are less than 80 μm.

According to the embodiment of the present invention, the conductivity of the circuit channels formed by the second B pores is at least 50 S, and the first conductive layers contact with the second conductive layers via the circuit channels.

The present invention discloses a multi-stack semiconductor device with an increased effective operation area. The semiconductor device comprises: a substrate; a first conductive layer formed on the substrate the first group of the semiconductor material layers, the second group of the semiconductor material layers and the third group of the semiconductor material layers. The first conductive layer is scribed by laser and the scribing being on the bottom of the first conductive layer to form a plurality of the first scribe lines whereby part of the first conductive layer is removed and the substrate damage is minimized. Each first scribe line is comprised of a plurality of the first pores, and each first pore partially overlaps with the neighboring first pore. The first group of the semiconductor material layers is comprised of a plurality of the semiconductor material layers and is formed on the first conductive layer, the second group of the semiconductor material layers is comprised of a plurality of the semiconductor material layers and is formed on the first group of the semiconductor material layers. The third group of the semiconductor material layers is comprised of a plurality of the semiconductor material layers and is formed on the second group of the semiconductor material layers. The first group of the semiconductor material layers, the second group of the semiconductor material layers and the third group of the semiconductor material layers are simultaneously scribed by laser and the scribing is on the bottom of the first group of the semiconductor material layers, whereby part of the first group of the semiconductor material layers, part of the second group of the semiconductor material layers and part of the third group of the semiconductor material layers are removed and the first conductive layer damage is minimized to form a plurality of the second scribe line. Each second scribe line is comprised of a plurality of the second pores. The second conductive layer is formed on the third group of the semiconductor material layers, the second conductive layer is scribed by laser and the scribing is on the bottom of the first group of the semiconductor material layers, whereby part of the first group of the semiconductor material layers, part of the second group of the semiconductor material layers, part of the third group of the semiconductor material layers and part of the second conductive layer are removed and the first conductive layer damage is minimized to form a plurality of the third scribe lines. Each third scribe line is comprised of a plurality of the third pores, and each third pore partially overlaps with the neighboring third pore. The second pores are shortened for shortening horizontal distance between the first scribe lines and the second scribe lines and/or the horizontal distance between the second scribe lines and the third scribe lines whereby the semiconductor device effective operation area is increased.

According to the embodiment of the present invention, semiconductor device further comprises: first middle layers located between the first group of the semiconductor material layers and the second group of the semiconductor material layers; and the second middle layers located between the second group of the semiconductor material layers and the third group of the semiconductor material layers, wherein the first middle layers and the second middle layers, the first group of the semiconductor material layers, the second group of the semiconductor material layers and the third group semiconductor layer are simultaneously scribed by laser.

According to the embodiment of the present invention, each second pore partially overlaps with the neighboring second pore.

According to the embodiment of the present invention, each second pore is distant from the neighboring second pore.

According to the embodiment of the present invention, the shortest distance between the central point of each second pore and the central point of the neighboring second pore is at least 20 μm.

According to the embodiment of the present invention, the shortest distance between the central point of the second pore and the pore boundary is less than 20 μm.

According to the embodiment of the present invention, the shortest distance between the central point of the first pores and the pore boundary is 5 to 20 μm.

According to the embodiment of the present invention, the shortest distance between the central point of the third pores and the pore boundary is 15 to 40 μm.

According to the embodiment of the present invention, the distance between the first scribe line and the second scribe line and/or the distance between the third scribe line and the second scribe line is less than 80 μm.

According to the embodiment of the present invention, the conductivity of the circuit channels formed by the second pores is at least 50 S, and the first conductive layers contact with the second conductive layers via the circuit channels.

The present invention discloses a multi-stack semiconductor device with an increased effective operation area, the semiconductor device comprising: a substrate; a first conductive layer formed on the substrate, the first group of the semiconductor material layers, the second group of the semiconductor material layers and the third group of the semiconductor material layers. The first conductive layer is scribed by laser and the scribing is on the bottom of the first conductive layer to form a plurality of the first scribe lines whereby part of the first conductive layer is removed and the substrate damage is minimized. Each first scribe line is comprised of a plurality of the first pores, and each first pore partially overlaps with the neighboring first pore. The first group of the semiconductor material layers is comprised of a plurality of the semiconductor material layers and is formed on the first conductive layer. The first group of the semiconductor material layers is scribed by laser and the scribing is on the bottom of the first group of the semiconductor material layers, whereby part of the first group of the semiconductor material layers is removed and the first conductive layer is minimized to form a plurality of the second A scribe lines. Each second A scribe line is comprised of a plurality of the second A pores. The second group of the semiconductor material layers is comprised of a plurality of the semiconductor material layers and is formed on the first group of the semiconductor material layers. The second group of the semiconductor material layers is scribed by laser and the scribing is on the bottom of the first group of the semiconductor material layers, whereby part of the first group of the semiconductor material layers and part of the second group of the semiconductor material layers are removed and the first conductive layer damage is minimized to form a plurality of the second B scribe lines. Each second B scribe line is comprised of a plurality of the second B pores. the third group of the semiconductor material layers comprised of a plurality of the semiconductor material layers and formed on the second group of the semiconductor material layers, the third group of the semiconductor material layers being scribed by laser and the scribing being on the bottom of the first group of the semiconductor material layers, whereby part of the first group of the semiconductor material layers, part of the second group of the semiconductor material layers and part of the third group of the semiconductor material layers are removed and the first conductive layer damage is minimized to form a plurality of the second C scribe lines, and each second C scribe line being comprised of a plurality of the second C pores; and the second conductive layer formed on the third group of the semiconductor material layers, the second conductive layer being scribed by laser and the scribing being on the bottom of the first group of the semiconductor material layers, whereby part of the first group of the semiconductor material layers, part of the second group of the semiconductor material layers, part of the third group of the semiconductor material layers and part of the second conductive layer are removed and the first conductive layer damage is minimized to form a plurality of the third scribe lines. Each third scribe line is comprised of a plurality of the third pores, and each third pore partially overlaps with the neighboring third pore, wherein the second A pores. The second B pores and/or the second C pores are shortened for shortening the horizontal distance between the first scribe lines and the second A scribe lines, the horizontal distance between the second A scribe lines and the second B scribe lines, the horizontal distance between the second B scribe lines and the second C scribe lines and/or the horizontal distance between the second C scribe lines and the third scribe lines, whereby the semiconductor device effective operation area is increased.

According to the embodiment of the present invention, semiconductor device further comprises: first middle layers located between the first group of the semiconductor material layers and the second group of the semiconductor material layers, and the first middle layers and the first group of the semiconductor material layers are simultaneously scribed by laser; and the second middle layers located between the second group of the semiconductor material layers and the third group of the semiconductor material layers, and the second middle layers and the second group of the semiconductor material layers simultaneously scribed by laser.

According to the embodiment of the present invention, each second A pore partially overlaps with the neighboring second A pore, each second B pore partially overlaps with the neighboring second B pore, and/or each second C pore partially overlaps with the neighboring second C pore.

According to the embodiment of the present invention, each second A pore is distant from the neighboring second A pore, each second B pore is distant from the neighboring second B pore, and/or each second C pore is distant from the neighboring second C pore.

According to the embodiment of the present invention, the distance between the central point of each second A pore and the central point of the neighboring second A pore, the central point of each second B pore and the central point of the neighboring second B pore and/or the shortest distance between the central point of each second C pore and the central point of the neighboring second C pore are at least 20 μm.

According to the embodiment of the present invention, the shortest distance between the central point of the second A pores, the central point of the second B pores and/or the central point of the second C pores and the boundary of the pores is less than 20 μm.

According to the embodiment of the present invention, the shortest distance between the central point of the first pores and the pore boundary is 5 to 20 μm.

According to the embodiment of the present invention, the shortest distance between the central point of the third pores and the pore boundary is 15 to 40 μm.

According to the embodiment of the present invention, the horizontal distance between the first scribe lines and the second A scribe lines, the horizontal distance between the second A scribe lines and the second B scribe lines, the horizontal distance between the second B scribe lines and the second C scribe lines and/or the horizontal distance between the second C scribe lines and the third scribe lines are less than 80 μm.

According to the embodiment of the present invention, the conductivity of the circuit channels formed by the second C pores is at least 50 S, and the first conductive layers contact with the second conductive layers via the circuit channels.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to preferred embodiments, being not used to limit its executing scope. Any equivalent variation and modification made according to appended claims is all covered by the claims claimed by the present invention.

The present invention relates to multi-stack semiconductor device with an improved effective operation area. The following embodiment is using a multi-stack thin film solar cell film group as an example.

FIG. 1A to FIG. 1H are cross-section views illustrating an embodiment of a method for forming a thin film solar cell film group 100 with two groups of the semiconductor material layers stack via laser scribing.

Figure 1A:
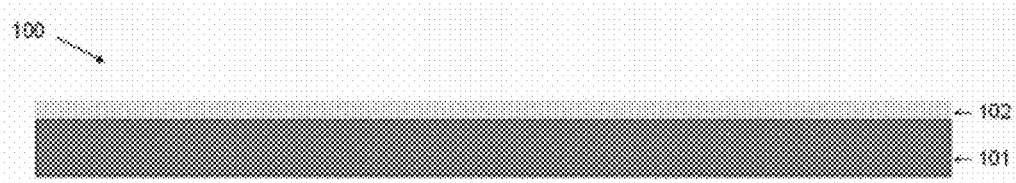
FIG. 1A to FIG. 1H are cross-section views illustrating an embodiment of a method for forming a thin film solar cell film group 100 with two groups of the semiconductor material layers stack via laser scribing.

In FIG. 1A, a first conductive layer 102 is deposited on a substrate 101.

Figure 1B:
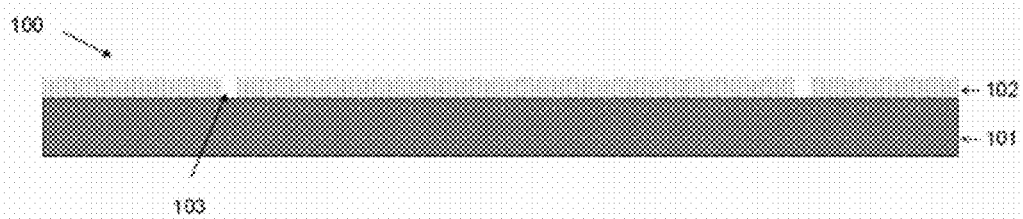

In FIG. 1B, a plurality of the first scribe lines 103 is scribed by laser on the first conductive layer 102, wherein a plurality of the first scribe lines 103 is scribed on the bottom of the first conductive layer 102, whereby part of the first conductive layer 102 is removed and the damage of the substrate 101 is minimized to form a plurality of the separated first conductive layers 102.

Figure 1C:
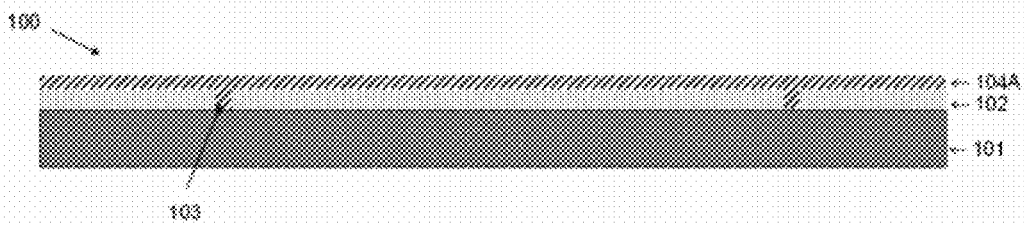

In FIG. 1C, the first group of the semiconductor material layers 104A is deposited on the first conductive layer 102. The first group of the semiconductor material layers 104A is comprised of a plurality of the semiconductor material layers.

Figure 1D:
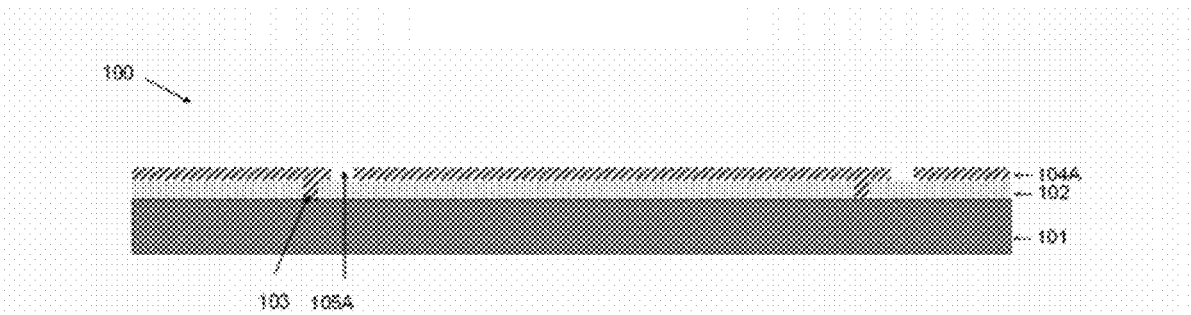

In FIG. 1D, a plurality of the second A scribe lines 105A is scribed by laser on the first group of the semiconductor material layers 104A, wherein a plurality of the second A scribe lines 105A is scribed on the bottom of the first group of the semiconductor material layers 104A, whereby part of the first group of the semiconductor material layers 104A is removed and the first conductive layer damage is minimized 102 to form a plurality of the separated first group of the semiconductor material layers 104A.

Figure 1E:
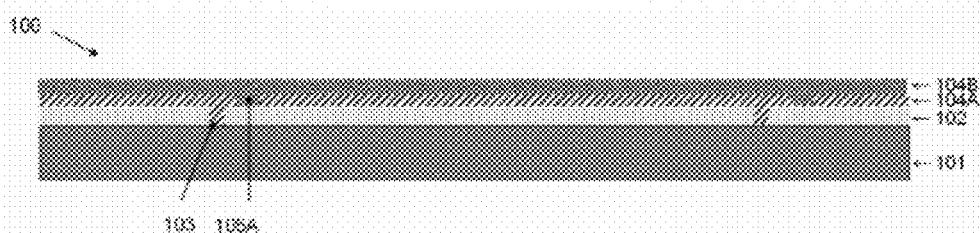

In FIG. 1E, the second group of the semiconductor material layers 104B is deposited on the first group of the semiconductor material layers 104A. The second group of the semiconductor material layers 104B is comprised of a plurality of the semiconductor material layers.

Figure 1F:
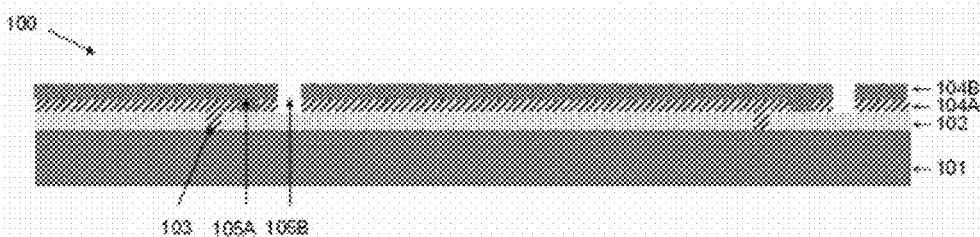

In FIG. 1F, a plurality of the second B scribe lines 105B is scribed by laser on the second group of the semiconductor material layers 104B, wherein a plurality of the second B scribe lines 105B is scribed on the bottom of the first group of the semiconductor material layers 104A, whereby part of the first group of the semiconductor material layers 104A and part of the second group of the semiconductor material layers 104B are removed and the first conductive layer damage is minimized 102 to form a plurality of the separated second group of the semiconductor material layers 104B.

Figure 1G:
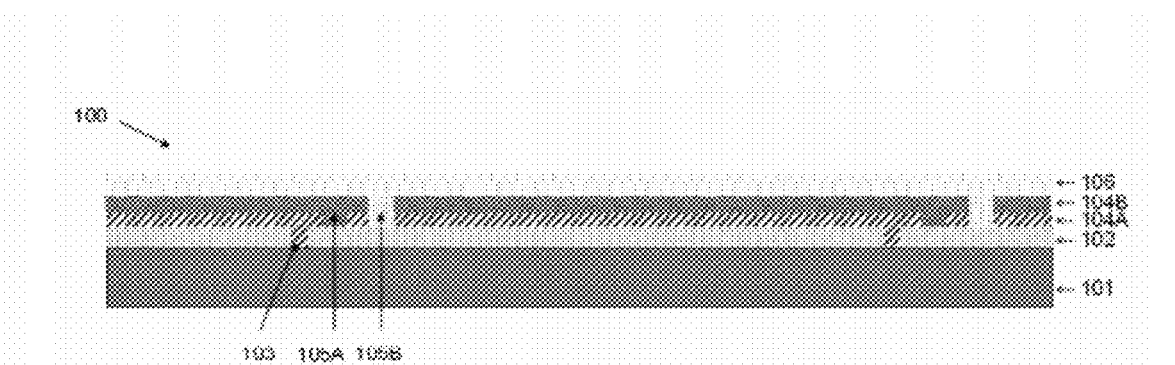

In FIG. 1G, the second conductive layer 106 is deposited on the second group of the semiconductor material layers 104B, the second conductive layer 106 of the cell unit is allowed to contact the first conductive layer 102 of the neighboring cell unit to form circuit channels to connect the neighboring cells in series.

Figure 1H:
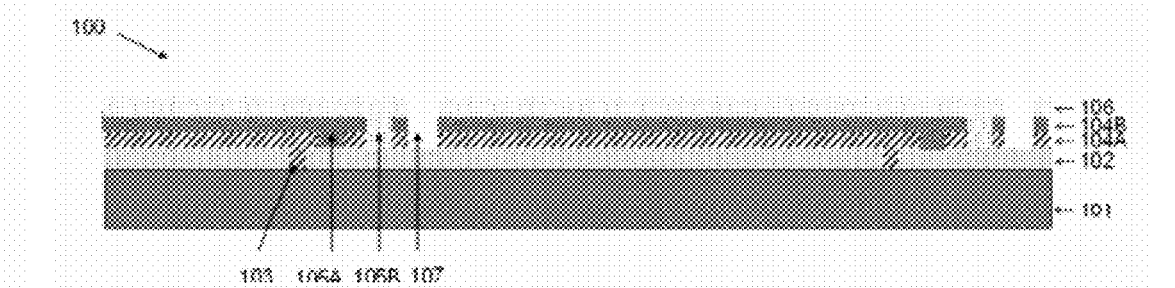

In FIG. 1H, a plurality of the third scribe lines 107 is scribed by laser on the second conductive layer 106, wherein a plurality of the third scribe lines 107 is scribed on the bottom of the first group of the semiconductor material layers 104A to form a plurality of the separated second conductive layer 106.

Thus, a thin film solar cell film group 100 with two groups of the semiconductor material layers stack according to the above mentioned method comprises: a substrate 101; a first conductive layer 102 and a second conductive layer 106. A first conductive layer 102 is formed on the substrate 101. A first group of the semiconductor material layers 104A is formed on the first conductive layer 102. A second group of the semiconductor material layers 104B is formed on the first group of the semiconductor material layers 104A. A second conductive layer 106 is formed on the second group of the semiconductor material layers 104B. The first conductive layer 102 is scribed by laser on the bottom of first conductive layer 102 to form a plurality of the first scribe lines 103. The first group of the semiconductor material layers 104A is scribed by laser on the bottom of first group of the semiconductor material layers 104A to form a plurality of the second A scribe lines 105A. The second group of the semiconductor material layers 104B is scribed by laser on bottom of the first group of the semiconductor material layers 104A to form a plurality of the second B scribe lines 105B. The second conductive layer 106 is scribed by laser on the bottom of the first group of the semiconductor material layers 104A to form a plurality of the third scribe lines 107.

Figure 2:
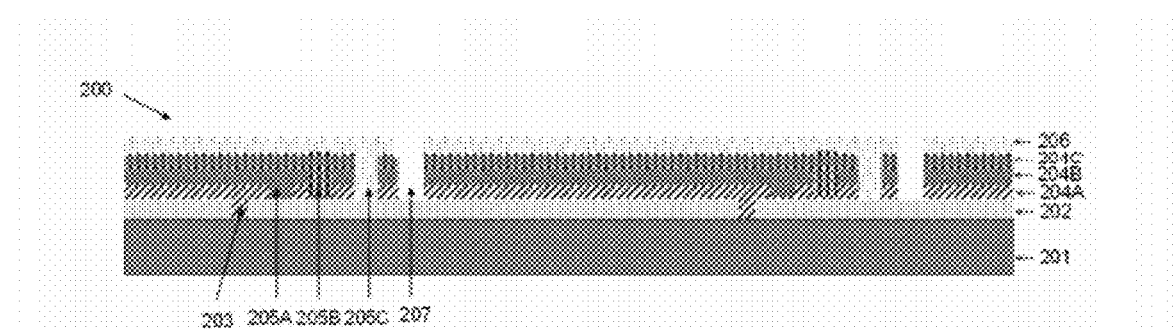
FIG. 2 is a cross-section view illustrating a thin film solar cell film group 200 with three groups of the semiconductor material layers stack.

The scope of the present invention is not limited to the above mentioned semiconductor device with two groups of the semiconductor material layers stack. In an embodiment of the present invention, n semiconductor device of the present invention comprises three groups of the semiconductor material layers stack as shown in FIG. 2. FIG. 2 is a cross-section view illustrating a thin film solar cell film group 200 with three groups of the semiconductor material layers stack.

In FIG. 2, the a thin film solar cell film group 200 with three groups of the semiconductor material layers stack comprises: a substrate 201; first conductive layer 202, the first group of the semiconductor material layers 204A, the second group of the semiconductor material layers 204B, the third group of the semiconductor material layers 204C and the second conductive layer 206. The first conductive layer 202 is formed on the substrate 201. The first group of the semiconductor material layers 204A is comprised of a plurality of the semiconductor material layers and formed on the first conductive layer 202. The second group of the semiconductor material layers 204B is comprised of a plurality of the semiconductor material layers and formed on the first group of the semiconductor material layers 204A. The third group of the semiconductor material layers 204C is comprised of a plurality of the semiconductor material layers and formed on the second group of the semiconductor material layers 204B. The second conductive layer 206 is formed on the third group of the semiconductor material layers 204C. The first conductive layer 202 is scribed by laser on the bottom of the first conductive layer 201 to form a plurality of the first scribe lines 203. The first group of the semiconductor material layers 204A is scribed by laser on the bottom of the first group of the semiconductor material layers to form a plurality of the second A scribe lines 205A. The second group of the semiconductor material layers 205B is scribed by laser on the bottom of the first group of the semiconductor material layers 205A to form a plurality of the second B scribe lines 205B. The third group of the semiconductor material layers 204C is scribed by laser on the bottom of the first group of the semiconductor material layers 204A to form a plurality of the second C scribe lines 205C. The second conductive layer 206 is scribed by laser on the bottom of the first group of the semiconductor material layers 204A to form a plurality of the third scribe lines 207.

Figure 3:
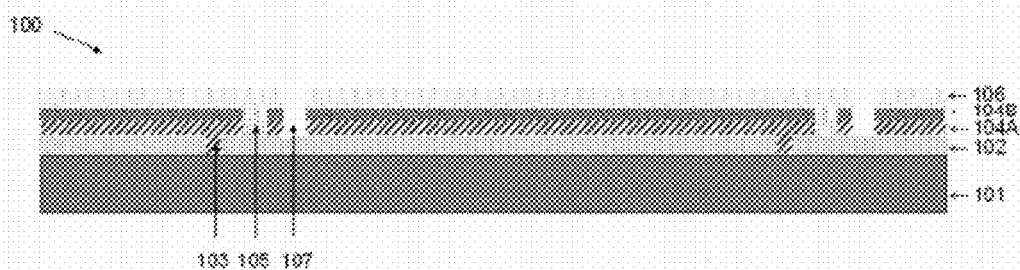
FIG. 3 is a cross-section view illustrating a thin film solar cell film group 100 with two groups of the semiconductor material layers stack according to another embodiment of the present invention.
Figure 4:
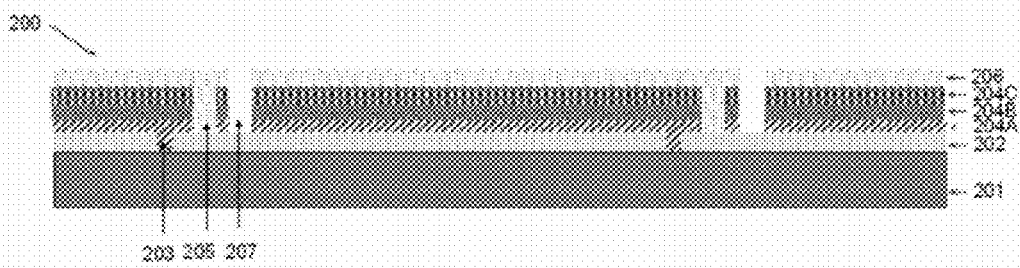
FIG. 4 is a cross-section view illustrating a thin film solar cell film group 200 with three groups of the semiconductor material layers stack according to another embodiment of the present invention.

In another embodiment of the present invention, either a thin film solar cell film group 100 with two groups of the semiconductor material layers stack or a thin film solar cell film group 200 with three groups of the semiconductor material layers stack can use other means of laser scribe lines as shown in FIG. 3 and FIG. 4. FIG. 3 is a cross-section view illustrating a thin film solar cell film group 100 with two groups of the semiconductor material layers stack according to another embodiment of the present invention. In FIG. 3, the characteristics of the embodiment are: the first group of the semiconductor material layers 104A and the second group of the semiconductor material layers 104B are simultaneously scribed by laser on the bottom of the first group of the semiconductor material layers 104A to form a plurality of the second scribe lines 105. FIG. 4 is a cross-section view illustrating a thin film solar cell film group 200 with three groups of the semiconductor material layers stack according to another embodiment of the present invention. In FIG. 4, the characteristics of the embodiment are: the first group of the semiconductor material layers 204A, the second group of the semiconductor material layers 204B and the third group of the semiconductor material layers 204C are simultaneously scribed by laser on the bottom of the first group of the semiconductor material layers 204A to form a plurality of the second scribe lines 105.

Figure 5:
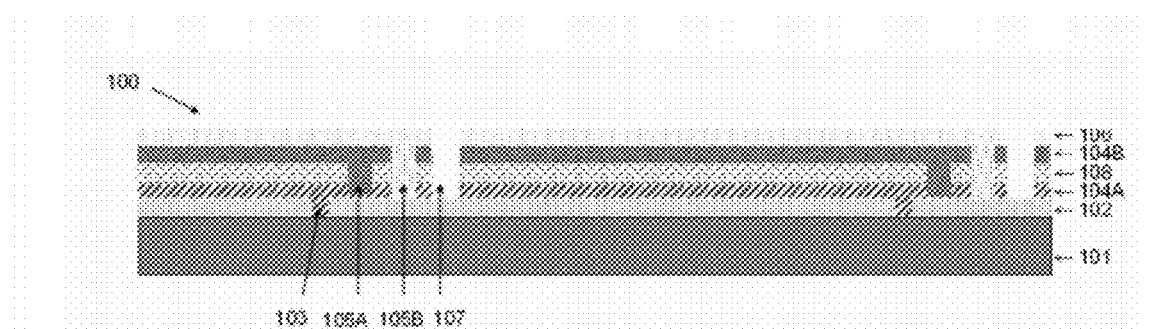
FIG. 5 is a cross-section view illustrating a thin film solar cell film group 100 with two groups of the semiconductor material layers stack according to another embodiment of the present invention.
Figure 6:
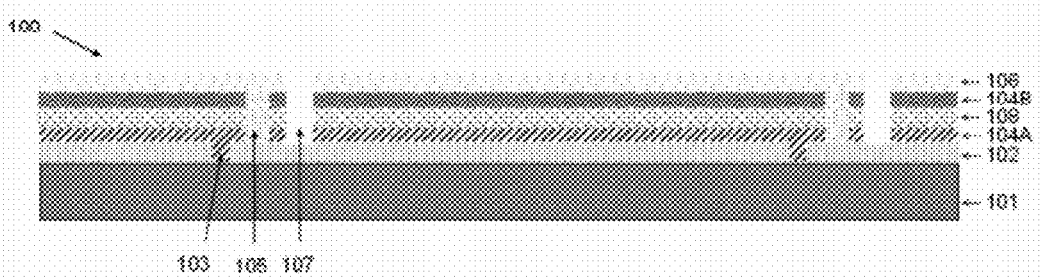
FIG. 6 is a cross-section view illustrating a thin film solar cell film group 100 with two groups of the semiconductor material layers stack according to another embodiment of the present invention.

In another embodiment of the present invention, either a thin film solar cell film group 100 with two groups of the semiconductor material layers stack or a thin film solar cell film group 200 with three groups of the semiconductor material layers stack further comprises at least one middle layers as shown in FIG. 5 and FIG. 6.

FIG. 5 is a cross-section view illustrating a thin film solar cell film group 100 with two groups of the semiconductor material layers stack according to another embodiment of the present invention. In FIG. 5, the characteristics of the embodiment are: the middle layers 108 are located between the first group of the semiconductor material layers 104A and the second group of the semiconductor material layers 104B. The middle layers 108 and the first group of the semiconductor material layers 104A are simultaneously scribed by laser.

FIG. 6 is a cross-section view illustrating a thin film solar cell film group 100 with two groups of the semiconductor material layers stack according to another embodiment of the present invention. In FIG. 6, the characteristics of the embodiment are: the middle layers 108 are located between the first group of the semiconductor material layers 104A and the second group of the semiconductor material layers 104B. The middle layers 108 the first group of the semiconductor material layers 104A and the second group of the semiconductor material layers 104B are simultaneously scribed by laser.

Figure 7:
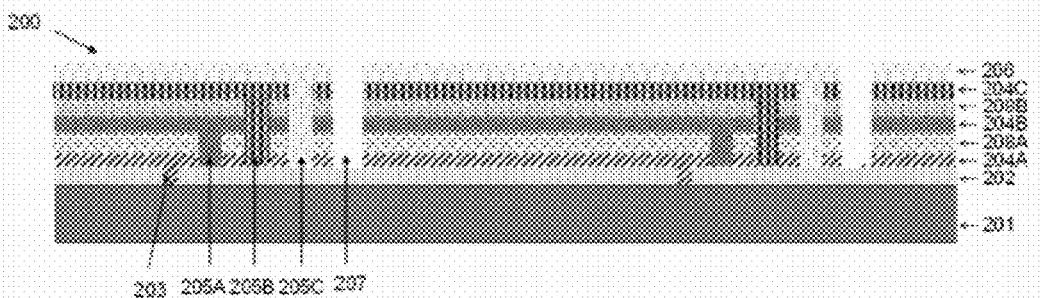
FIG. 7 is a cross-section view illustrating a thin film solar cell film group 200 with three groups of the semiconductor material layers stack according to another embodiment of the present invention.

FIG. 7 is a cross-section view illustrating a thin film solar cell film group 200 with three groups of the semiconductor material layers stack according to another embodiment of the present invention. In FIG. 7, the characteristics of the embodiment are: the first middle layers 208A are located between the first group of the semiconductor material layers 204A and the second group of the semiconductor material layers 204B, the second middle layers 208B is located between the second group of the semiconductor material layers 204B and the third group of the semiconductor material layers 204C. The first middle layers 208A, the first group of the semiconductor material layers 204A are simultaneously scribed by laser. The second middle layers 208B, the second group of the semiconductor material layers 204B are simultaneously scribed by laser.

Figure 8:
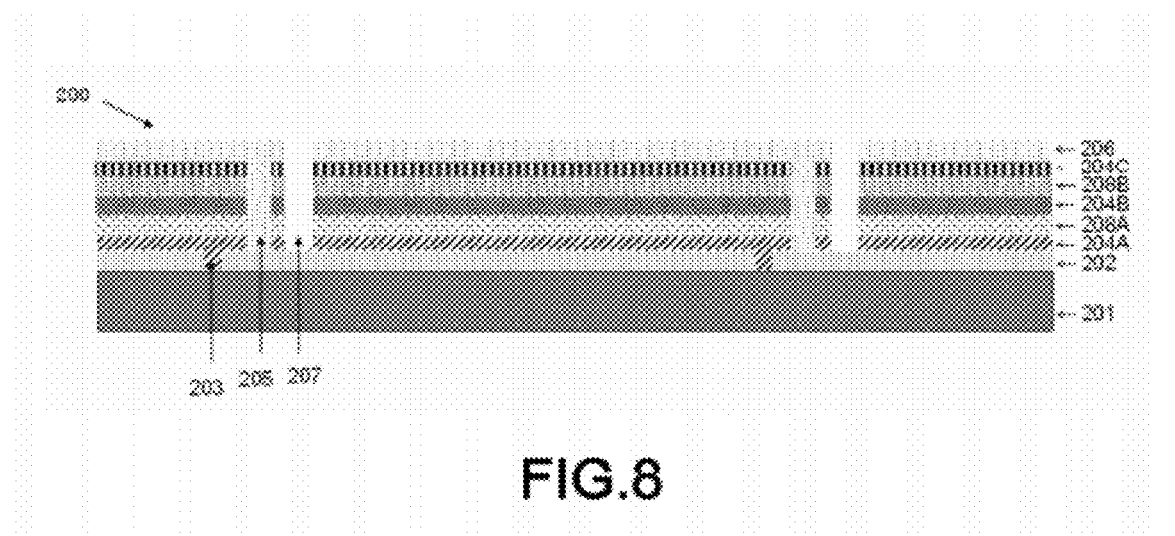
FIG. 8 is a cross-section view illustrating a thin film solar cell film group 200 with three groups of the semiconductor material layers stack according to another embodiment of the present invention.

FIG. 8 is a cross-section view illustrating a thin film solar cell film group 200 with three groups of the semiconductor material layers stack according to another embodiment of the present invention. In FIG. 8, the characteristics of the embodiment are: the first middle layers 208A is located between the first group of the semiconductor material layers 204A and the second group of the semiconductor material layers 204B, the second middle layers 208B is located between the second group of the semiconductor material layers 204B and the third group of the semiconductor material layers 204C. The first middle layers 208A and the second middle layers 208B, the first group of the semiconductor material layers 204A, the second group of the semiconductor material layers 204B and the third group semiconductor layer 204C are simultaneously scribed by laser.

Figure 9A:
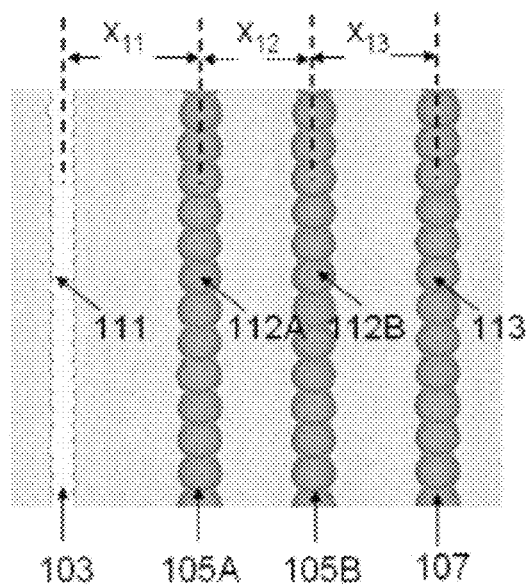
FIG. 9A to FIG. 9C are plan views illustrating the first scribe lines 103, the second A scribe lines 105A, the second B scribe lines 105B and the third scribe lines 107 scribed by laser.
Figure 9B:
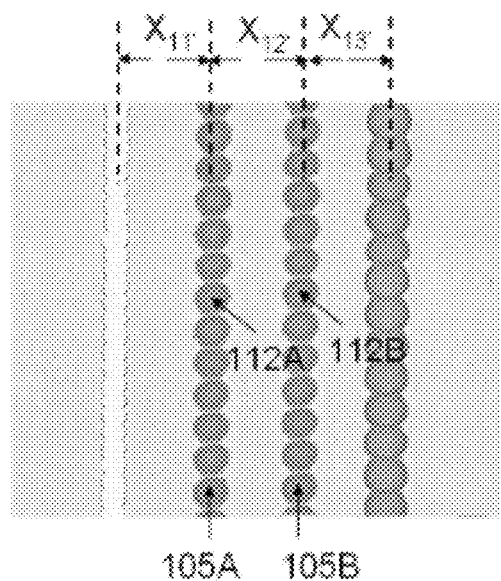
Figure 9C:
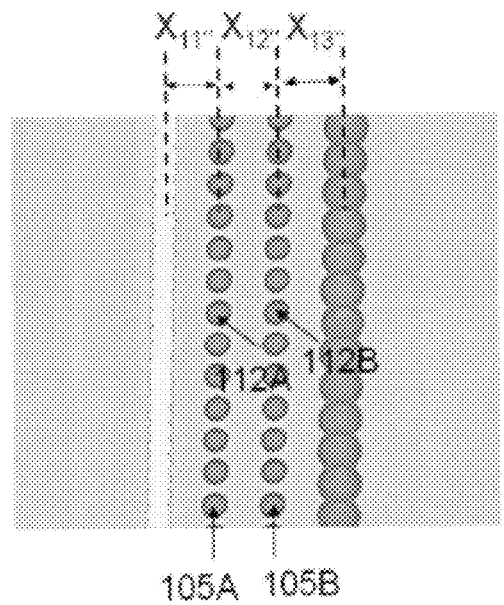
Figure 9D:
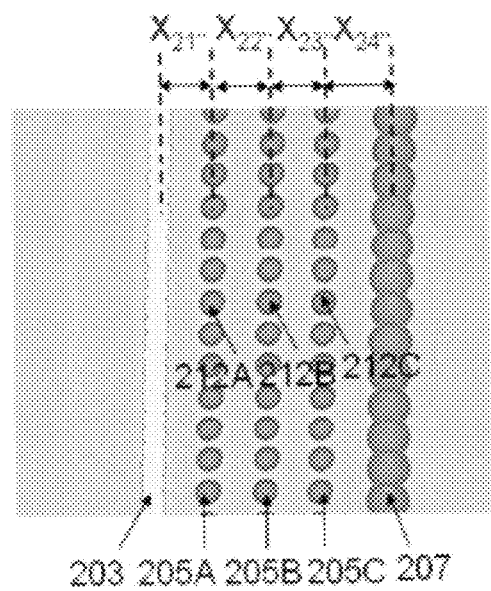

FIG. 9A to FIG. 9C are plan views illustrating the first scribe lines 103, the second A scribe lines 105A, the second B scribe lines 105B and the third scribe lines 107 scribed by laser. The means of laser scribing uses laser beam spots of specific dimensions for removing materials on specific positions to form continuous pores, wherein parts of the pores overlap with each other and form scribe lines. In FIG. 9A, each first scribe line 103 is comprised of a plurality of the first pores 111, and each first pore 111 partially overlaps with the neighboring first pores 111. Each second A scribe line 105A is comprised of a plurality of the second A pores 112A, and each second A pore 112A partially overlaps with the neighboring second A pore 112A. Each second B scribe lines 105B is comprised of a plurality of the second B pores 112B, and each second B pore 112B partially overlaps with the neighboring second B pore 112B. Each third scribe line 107 is comprised of a plurality of the third pores 113, and each third pore 113 partially overlaps with the neighboring third pores 113.

In addition, each scribe line of the plurality of the first scribe lines 103 is substantially parallel to each other. Each scribe line of the plurality of the second A scribe lines 105A is substantially parallel to each other. Each scribe line of the plurality of the second B scribe lines 105B is substantially parallel to each other. Each scribe line of the plurality of the third scribe lines 107 is substantially parallel to each other. The first scribe lines 103, the second A scribe lines 105A, the second B scribe lines 105B and the third scribe lines 107 are substantially parallel to each other.

In FIG. 9A, the horizontal median distance x11 between the first scribe lines 103 and the second A scribe lines 105A, the horizontal median distance x12 between the second A scribe lines 105A and the second B scribe lines 105B, and horizontal median distance x13 the second B scribe lines 105B and the third scribe lines 107 are about 100 μm. It should be noted that: the term "median distance" refers to the distance between a central line of a scribe line and a central line of another scribe line, where two central lines parallel with each other.

When performing laser scribing, the first scribe lines 103, the second A scribe lines 105A, the second B scribe lines 105B and the third scribe lines 107 must be as close to each other as possible. Due to the offset of the first scribe lines 103, the second A scribe lines 105A, the second B scribe lines 105B and the third scribe lines 107 generated by factors such as temperature during laser scribing, laser beam points may not arrive on target positions precisely. Accordingly, appropriate miss distances between the first scribe lines 103, the second A scribe lines 105A, the second B scribe lines 105B and the third scribe lines 107 have to be reserved for avoid scribe lines overlapping and generating leakage currents or shorts. However, it is difficult to shorten the horizontal distances between the first scribe lines 103, the second A scribe lines 105A, the second B scribe lines 105B and the third scribe lines 107 and reserve appropriate miss distance at the same time.

The above mentioned example uses the thin film solar cell film group 100 with two groups of the semiconductor material layers stack. The same issue may occur to a thin film solar cell film group 200 with three groups of the semiconductor material layers stack.

Accordingly, the method of the present invention uses the above mentioned laser scribing to form thin film solar cell film group 100, 200 in series (as shown in FIG. 1A to FIG. 1H) via out of focus technique and/or lowering laser power in order to shorten laser beam spot dimensions and shorten the second pores in the step using laser for scribing the plurality of the second A scribe lines 105A and the plurality of the second B scribe lines 105B on the first group of the semiconductor material layers 104A and/or the second group of the semiconductor material layers 104B. It should be noted that because the laser power is lowered, the laser life time is increased and manufacturing cost efficiency is improved.

FIG. 9A to FIG. 9B are plan views illustrating the first scribe lines 103, the second A scribe lines 105A, the second B scribe lines 105B and the third scribe lines 107 scribed by laser. In FIG. 9B and FIG. 9C, the radius of the second A pores and the second B pores is shortened to be less than 20 μm, and the radius of the first pores 111 is kept at 5 to 20 μm, the radius of the third pores 113 is kept at 15 to 40 μm. Compare to FIG. 2A, the second A pores 112A and the second B pores 112B are shortened, the first pores 111 and the third pores 113 are kept on the same sizes. Though the first pores 111, the second A pores 112A, the second B pores 112B and the third pores 113 circular pores according to the above embodiments, the present invention is not limited thereto. The first pores 111, the second A pores 112A, the second B pores 112B and the third pores 113 may be pores of various shapes, for example, shapes of a square, a triangle, an ellipse.

In an embodiment as shown in FIG. 9B, the horizontal median distance x11' between the first scribe lines and the second A scribe lines, the horizontal median distance x12' between the second A scribe lines and the second B scribe lines and the horizontal median distance x13 between the second B scribe lines and the third scribe lines can be reduced to be less than 80 μm, yet an appropriate miss distance is reserved. In a more preferred embodiment as shown in FIG. 2C, the horizontal median distance x11" between the first scribe lines and the second A scribe lines, the horizontal median distance x12" between the second A scribe lines and the second B scribe lines and the horizontal median distance x13" between the second B scribe lines and the third scribe lines can be reduced to be less than 50 μm, yet an appropriate miss distance is reserved. Because the horizontal median distance x11', x11", between the first scribe lines and the second A scribe lines the horizontal median distance x12', x12" between the second A scribe lines and the second B scribe lines and the horizontal median distance x13', x13" between the second B scribe lines and the third scribe lines are reduced, the area for generating power in a solar cell module increases.

In the steps of generating the plurality of the second A scribe lines 105A by using laser scribing, each second A pore 112A can partially overlap with the neighboring second A pore 112A, that is, the plurality of the second A scribe lines 105A are through scribe lines as shown in FIG. 9B. Each second A pore 112A may also not overlap with the neighboring second A pore 112A, that is, the plurality of the second A scribe lines 105A are formed by the second A pores 112A not connected to each other. The shortest distance between the central point of each second A pore 112A and the central point of the second A pore 112A can be at least 20 μm as shown in FIG. 2C. Though shortening second A pores 112A, changing frequency of laser pulse shooting and/or changing moving speed of laser beam or substrate platform of the loading machine may cause that each second A pores 112A do not overlap with neighboring second A pores 112A, the conductivity between components and components on the first conductive layer 102 and the second conductive layer 106 is not significantly impacted. This is because that an appropriate contact area between the first conductive layer 102 and the second conductive layer 106 and an appropriate thickness of the first group of the semiconductor material layers 104A and the second group of the semiconductor material layers 104B are kept.

At the same time, because each second A pore 112A may not overlap with the neighboring second A and separated from each other, the amount of the second pores 112A is lowered which means the laser scribing speed increases and the manufacturing speed is improved.

Though the above mentioned embodiment is implemented by shortening the second A pores 112A, the present invention is not limited thereto, the present invention can be implemented by shortening the second B pores 112B.

In addition, the conductivity of the circuit channels formed by the second B pores 112B (which allow the first conductive layer 102 contact the second conductive layer 106) is in proportion to the cross section area of the second B pores 112B and in inverse proportion to the total thickness of the first group of the semiconductor material layers 104A and the second group of the semiconductor material layers 104B (i.e., the length of the circuit channels). For example, in an embodiment according to the present invention, when the resistance of the first conductive layer 102 and the second conductive layer 106 (the conductive layer used is ZnO:B) is $1.9 \times 10^{-3}$ Ω-cm, the total thickness of the first group of the semiconductor material layers 104A and the second group of the semiconductor material layers 104B is 950 nm, and the cross section area of the second B pores 112B (the radius used is 20 μm) is 1256 μm2, the conductivity is 71.1 S. Yet the present invention is not limited to the above mentioned embodiments, the present invention can further change the material or the thickness of the first conductive layer 102 and the second conductive layer 106, change the thickness of the first group of the semiconductor material layers 104A, the second group of the semiconductor material layers 104B or change the dimensions of the second B pores 112B. It should be noted that: the conductivity of the circuit channels formed by the second B pores 112B has to be at least 50 S such that the conductivity is not impacted.

It should be noted that: though the present invention the horizontal median distance x11', x11" between the first scribe lines and the second A scribe lines the horizontal median distance x12', x12" between the second A scribe lines and the second B scribe lines and the horizontal median distance x13', x13" between the second B scribe lines and the third scribe lines are shortened by shortening the second A pores 112A and the second B pores 112B, the horizontal median distance x11', x11" between the first scribe lines and the second A scribe lines, the horizontal median distance x12', x12" between the second A scribe lines and the second B scribe lines and the horizontal median distance x13', x13" between the second B scribe lines and the third scribe lines are not shortened by shortening the first pores 111 or the third pores 113. This is because shortening the first pores 111 and the third pores 113 may result in that the pores do not overlap with each other and the insulative property of the plurality of the separated first conductive layer 102 and the plurality of the separated second conductive layer 106 is impacted.

Figure 10:
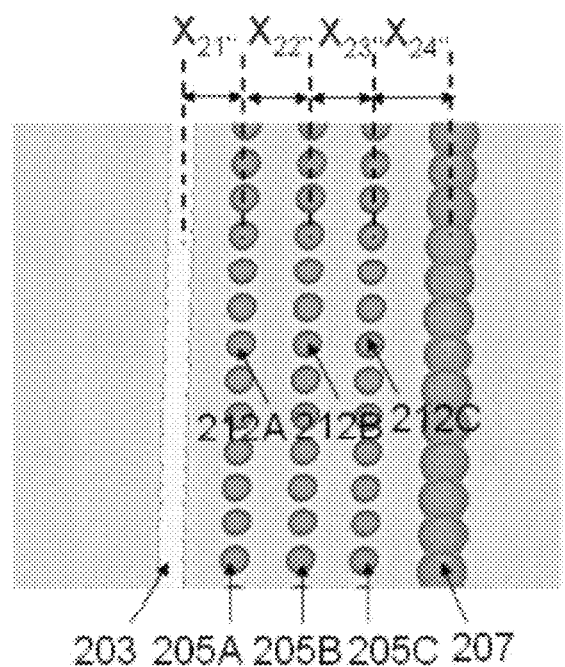
FIG. 10 is a plan view illustrating the first scribe lines 203, the second A scribe lines 205A, the second B scribe lines 205B, the second C scribe lines 205C and the third scribe lines 207 scribed by laser.

Equally, though the above mentioned embodiment uses example of a thin film solar cell film group 100 with two groups of the semiconductor material layers stack, the present invention is not limited thereto. The same method applies to a thin film solar cell film group 200 with three groups of the semiconductor material layers stack. As shown in FIG. 10, the horizontal median distance x21" between the first scribe lines and the second A scribe lines, the horizontal median distance x22" between the second A scribe lines and the second B scribe lines, the horizontal median distance x23" between the second B scribe lines and the second C scribe lines and the horizontal median distance x24" between the second C scribe lines and the third scribe lines can be shortened via shortening the second A pores 212A, the second B pores 212B and the second C pores 212C according to the present invention. It should be noted that: the conductivity of the circuit channels formed by the second C pores 212C has to be at least 50 S such that the conductivity is not impacted.

In the above embodiments of the present invention, the substrate 101, 201 can be made by glass, metal, ceramic or plastic materials. The first conductive layer 102, 202 or the second conductive layer 106, 206 can be transparent conductive films made by zinc oxide, indium tin oxides, tin oxides or metal films made by silver, aluminum, gold, copper, molybdenum, titanium. The semiconductor material layers 104A, 104B, 204A, 204B, 204C can be amorphous silicon thin films, nano-crystalline silicon thin films, microcrystalline silicon thin films, polycrystalline silicon thin films, copper indium diselenide thin films, copper indium gallium diselenide thin films, copper indium gallium sulfur selenide thin films, cadmium sulfide thin film,) aluminium gallium nitride thin films, gallium aluminum arsenide thin films, gallium nitride thin films, indium phosphide or gallium indium phosphide thin films, or a combination of the above mentioned materials. The materials of middle layers 108, 208A, 208B comprise: SiOX films, transparent conductive films or metal films, or a combination of the above mentioned materials, wherein the metal films can be ultra thin and partially transparent.

The embodiments of the present invention uses silicon thin film solar cell module as an example. The present invention is not limited thereto. The method of the present invention can also used for laser scribing in other applications in semiconductors and optoelectronics.

As the skilled person will appreciate, various changes and modifications can be made to the described embodiments. It is intended to include all such variations, modifications and equivalents which fall within the scope of the invention, as defined in the accompanying claims.

What is claimed is:

1. A multi-stack semiconductor device with an increased effective operation area, the semiconductor device comprising:
   a substrate;
   a first conductive layer formed on the substrate, the first conductive layer having laser-processed scribing to form a plurality of first scribe lines whereby part of the first conductive layer is removed to expose the substrate, each first scribe line being comprised of a plurality of the first pores, and each first pore partially overlapping with the neighboring first pore;

a first group of the semiconductor material layers and a second group of the semiconductor material layers, the first group of the semiconductor material layers being comprised of a plurality of the semiconductor material layers and formed on the first conductive layer, the second group of the semiconductor material layers being comprised of a plurality of the semiconductor material layers and formed on the first group of the semiconductor material layers, the first group of the semiconductor material layers and the second group of the semiconductor material layers having laser-processed scribing to form a plurality of second scribe lines whereby part of the first group of the semiconductor material layers and part of the second group of the semiconductor material layers are removed to expose the first conductive layer, and each second scribe line being comprised of a plurality of the second pores;

a second conductive layer formed on the second group of the semiconductor material layers, the second conductive layer having laser-processed scribing to form a plurality of third scribe lines whereby part of the first group of the semiconductor material layers, part of the second group of the semiconductor material layers and part of the second conductive layer are removed to expose the first conductive layer, each third scribe line being comprised of a plurality of the third pores, and each third pore partially overlapping with the neighboring third pore;

wherein the second pores are shortened for shortening horizontal distance between the first scribe lines and the second scribe lines and/or the horizontal distance between the second scribe lines and the third scribe lines whereby the semiconductor device effective operation area is increased, and wherein each second pore is distant from the neighboring second pore.

2. The semiconductor device of claim 1, further comprising middle layers located between the first group of the semiconductor material layers and the second group of the semiconductor material layers, wherein the middle layers, the first group of the semiconductor material layers and the second group of the semiconductor material layers are scribed by laser simultaneously.

3. The semiconductor device of claim 1, wherein each second pore partially overlaps with the neighboring second pore.

4. The semiconductor device of claim 1, wherein the shortest distance between the central point of each second pore and the central point of the neighboring second pore is at least 20 μm.

5. The semiconductor device of claim 1, wherein the shortest distance between the central point of the second pore and the pore boundary is less than 20 μm.

6. The semiconductor device of claim 1, wherein the shortest distance between the central point of the first pores and the pore boundary is 5 to 20 μm.

7. The semiconductor device of claim 1, wherein the shortest distance between the central point of the third pores and the pore boundary is 15 to 40 μm.

8. The semiconductor device of claim 1, wherein the distance between the first scribe line and the second scribe line and/or the distance between the third scribe line and the second scribe line is less than 80 μm.

9. The semiconductor device of claim 1, wherein the conductivity of the circuit channels formed by the second pores is at least 50 S, and the first conductive layers contact with the second conductive layers via the circuit channels.

10. A multi-stack semiconductor device with an increased effective operation area, the semiconductor device comprising:

a substrate;

a first conductive layer formed on the substrate, the first conductive layer having laser-processed scribing to form a plurality of first scribe lines whereby part of the first conductive layer is removed to expose the substrate, each first scribe line being comprised of a plurality of the first pores, and each first pore partially overlapping with the neighboring first pore;

a first group of the semiconductor material layers comprised of a plurality of the semiconductor material layers and formed on the first conductive layer, the first group of the semiconductor material layers having laser-processed scribing to form a plurality of second A scribe lines whereby part of the first group of the semiconductor material layers is removed to expose the first conductive layer, and each second A scribe line being comprised of a plurality of the second A pores;

a second group of the semiconductor material layers comprised of a plurality of the semiconductor material layers and formed on the first group of the semiconductor material layers, the second group of the semiconductor material layers having laser-processed scribing to form a plurality of second B scribe lines whereby part of the first group of the semiconductor material layers and part of the second group of the semiconductor material layers are removed to expose the first conductive layer, each second B scribe line being comprised of a plurality of the second B pores; and a second conductive layer formed on the second group of the semiconductor material layers, the second conductive layer having laser-processed scribing to form a plurality of third scribe lines whereby part of the first group of the semiconductor material layers, part of the second group of the semiconductor material layers and part of the second conductive layer are removed to expose the first conductive layer, each third scribe line being comprised of a plurality of the third pores, and each third pore partially overlapping with the neighboring third pore, wherein the second A pores and/or the second B pores are shortened for shortening the horizontal distance between the first scribe lines and the second A scribe lines, the horizontal distance between the second A scribe lines and the second B scribe lines and/or the horizontal distance between the second B scribe lines and the third scribe lines, whereby the semiconductor device effective operation area is increased, and wherein each second A pore is distant from the neighboring second A pore, and/or each second B pore is distant from the neighboring second B pore.

11. The semiconductor device of claim 10, further comprising middle layers located between the first group of the semiconductor material layers and the second group of the semiconductor material layers, the middle layers and the first group of the semiconductor material layers being simultaneously scribed by laser.

12. The semiconductor device of claim 10, wherein each second A pore partially overlaps with the neighboring second A pore, and/or each second B pore partially overlaps with neighboring second B pores.

13. The semiconductor device of claim 10, wherein the distance between the central point of each second A pore and the central point of the neighboring second A pore and/or the shortest distance between the central point of each second B pore and the central point of the neighboring second B pore are at least 20 μm.

14. The semiconductor device of claim 10, wherein the shortest distance between the second A pores and/or the central point of the second B pores and the boundary of the pores is less than 20 μm.

15. The semiconductor device of claim 10, wherein the shortest distance between the central point of the first pores and the pore boundary is 5 to 20 μm.

16. The semiconductor device of claim 10, wherein the shortest distance between the central point of the third pores and the pore boundary is 15 to 40 μm.

17. The semiconductor device of claim 10, wherein the horizontal distance between the first scribe lines and the second A scribe lines, the horizontal distance between the second A scribe lines and the second B scribe lines, and/or the horizontal distance between the second B scribe lines and the third scribe lines are less than 80 μm.

18. The semiconductor device of claim 10, wherein the conductivity of the circuit channels formed by the second B pores is at least 50 S, and the first conductive layers contact with the second conductive layers via the circuit channels.

19. A multi-stack semiconductor device with an increased effective operation area, the semiconductor device comprising:
a substrate;
a first conductive layer formed on the substrate, the first conductive layer having laser-processed scribing to form a plurality of first scribe lines whereby part of the first conductive layer is removed to expose the substrate, each first scribe line being comprised of a plurality of the first pores, and each first pore partially overlapping with the neighboring first pore;
a first group of the semiconductor material layers, a second group of the semiconductor material layers and a third group of the semiconductor material layers, the first group of the semiconductor material layers being comprised of a plurality of the semiconductor material layers and formed on the first conductive layer, the second group of the semiconductor material layers being comprised of a plurality of the semiconductor material layers and formed on the first group of the semiconductor material layers, and the third group of the semiconductor material layers being comprised of a plurality of the semiconductor material layers and formed on the second group of the semiconductor material layers, the first group of the semiconductor material layers, the second group of the semiconductor material layers and the third group of the semiconductor material layers having laser-processed scribing to form a plurality of second scribe lines whereby part of the first group of the semiconductor material layers, part of the second group of the semiconductor material layers and part of the third group of the semiconductor material layers are removed to expose the first conductive layer, and each second scribe line being comprised of a plurality of the second pores;
a second conductive layer formed on the third group of the semiconductor material layers, the second conductive layer having laser-processed scribing to form a plurality of third scribe lines whereby part of the first group of the semiconductor material layers, part of the second group of the semiconductor material layers, part of the third group of the semiconductor material layers and part of the second conductive layer are removed to expose the first conductive layer, each third scribe line being comprised of a plurality of the third pores, and each third pore partially overlapping with the neighboring third pore,
wherein the second pores are shortened for shortening horizontal distance between the first scribe lines and the second scribe lines and/or the horizontal distance between the second scribe lines and the third scribe lines whereby the semiconductor device effective operation area is increased, and
wherein each second pore is distant from the neighboring second pore.

20. The semiconductor device of claim 19, further comprising:
first middle layers located between the first group of the semiconductor material layers and the second group of the semiconductor material layers; and
second middle layers located between the second group of the semiconductor material layers and the third group of the semiconductor material layers,
wherein the first middle layers and the second middle layers, the first group of the semiconductor material layers, the second group of the semiconductor material layers and the third group semiconductor layer are simultaneously scribed by laser.

21. The semiconductor device of claim 19, wherein each second pore partially overlaps with the neighboring second pore.

22. The semiconductor device of claim 19, wherein the shortest distance between the central point of each second pore and the central point of the neighboring second pore is at least 20 μm.

23. The semiconductor device of claim 19, wherein the shortest distance between the central point of the second pore and the pore boundary is less than 20 μm.

24. The semiconductor device of claim 19, wherein the shortest distance between the central point of the first pores and the pore boundary is 5 to 20 μm.

25. The semiconductor device of claim 19, wherein the shortest distance between the central point of the third pores and the pore boundary is 15 to 40 μm.

26. The semiconductor device of claim 19, wherein the distance between the first scribe line and the second scribe line and/or the distance between the third scribe line and the second scribe line is less than 80 μm.

27. The semiconductor device of claim 19, wherein the conductivity of the circuit channels formed by the second pores is at least 50 S, and the first conductive layers contact with the second conductive layers via the circuit channels.

28. A multi-stack semiconductor device with an increased effective operation area, the semiconductor device comprising:
a substrate;
a first conductive layer formed on the substrate, the first conductive layer having laser-processed scribing to form a plurality of first scribe lines whereby part of the first conductive layer is removed to expose the substrate, each first scribe line being comprised of a plurality of the first pores, and each first pore partially overlapping with the neighboring first pore;
a first group of the semiconductor material layers comprised of a plurality of the semiconductor material layers and formed on the first conductive layer, the first group of the semiconductor material layers having laser-processed scribing to form a plurality of second A scribe lines whereby part of the first group of the semiconductor material layers is removed to expose the first conductive layer, and each second A scribe line being comprised of a plurality of the second A pores;

a second group of the semiconductor material layers comprised of a plurality of the semiconductor material layers and formed on the first group of the semiconductor material layers, the second group of the semiconductor material layers having laser-processed scribing to form a plurality of second B scribe lines whereby part of the first group of the semiconductor material layers and part of the second group of the semiconductor material layers are removed to expose the first conductive layer each second B scribe line being comprised of a plurality of the second B pores;

a third group of the semiconductor material layers comprised of a plurality of the semiconductor material layers and formed on the second group of the semiconductor material layers, the third group of the semiconductor material layers having laser-processed scribing to form a plurality of second C scribe lines whereby part of the first group of the semiconductor material layers, part of the second group of the semiconductor material layers and part of the third group of the semiconductor material layers are removed to expose the first conductive layer, and each second C scribe line being comprised of a plurality of the second C pores; and a second conductive layer formed on the third group of the semiconductor material layers, the second conductive layer having laser-processed scribing to form a plurality of third scribe lines, whereby part of the first group of the semiconductor material layers, part of the second group of the semiconductor material layers, part of the third group of the semiconductor material layers and part of the second conductive layer are removed to expose the first conductive layer damage, each third scribe line being comprised of a plurality of the third pores, and each third pore partially overlapping with the neighboring third pore, wherein the second A pores, the second B pores and/or the second C pores are shortened for shortening the horizontal distance between the first scribe lines and the second A scribe lines, the horizontal distance between the second A scribe lines and the second B scribe lines, the horizontal distance between the second B scribe lines and the second C scribe lines and/or the horizontal distance between the second C scribe lines and the third scribe lines, whereby the semiconductor device effective operation area is increased, and wherein each second A pore is distant from the neighboring second A pore, each second B pore is distant from the neighboring second B pore, and/or each second C pore is distant from the neighboring second C pore.

29. The semiconductor device of claim 28, further comprising:

first middle layers located between the first group of the semiconductor material layers and the second group of the semiconductor material layers, and the first middle layers and the first group of the semiconductor material layers are simultaneously scribed by laser; and second middle layers located between the second group of the semiconductor material layers and the third group of the semiconductor material layers, and the second middle layers and the second group of the semiconductor material layers simultaneously scribed by laser.

30. The semiconductor device of claim 28, wherein each second A pore partially overlaps with the neighboring second A pore, each second B pore partially overlaps with the neighboring second B pore, and/or each second C pore partially overlaps with the neighboring second C pore.

31. The semiconductor device of claim 28, wherein the distance between the central point of each second A pore and the central point of the neighboring second A pore, the central point of each second B pore and the central point of the neighboring second B pore and/or the shortest distance between the central point of each second C pore and the central point of the neighboring second C pore are at least 20 µm.

32. The semiconductor device of claim 28, wherein the shortest distance between the central point of the second A pores, the central point of the second B pores and/or the central point of the second C pores and the boundary of the pores is less than 20 µm.

33. The semiconductor device of claim 28, wherein the shortest distance between the central point of the first pores and the pore boundary is 5 to 20 µm.

34. The semiconductor device of claim 28, wherein the shortest distance between the central point of the third pores and the pore boundary is 15 to 40 µm.

35. The semiconductor device of claim 28, wherein the horizontal distance between the first scribe lines and the second A scribe lines, the horizontal distance between the second A scribe lines and the second B scribe lines, the horizontal distance between the second B scribe lines and the second C scribe lines and/or the horizontal distance between the second C scribe lines and the third scribe lines are less than 80 µm.

36. The semiconductor device of claim 28, wherein the conductivity of the circuit channels formed by the second C pores is at least 50 S, and the first conductive layers contact with the second conductive layers via the circuit channels.

* * * * *